United States Patent [19]

Geller

[11] 4,328,434

[45] May 4, 1982

[54] COMPARATOR CIRCUIT WITH OFFSET CORRECTION

[75] Inventor: William L. Geller, Framingham, Mass.

[73] Assignee: GTE Laboratories Incorporated, Waltham, Mass.

[21] Appl. No.: 95,136

[22] Filed: Nov. 16, 1979

[51] Int. Cl.³ .............................................. H03K 5/153
[52] U.S. Cl. ..................................... 307/359; 328/162
[58] Field of Search ................. 307/359; 328/162, 165, 328/127

[56] References Cited

U.S. PATENT DOCUMENTS

| | | | |
|---|---|---|---|
| 3,200,338 | 8/1965 | Ellis | 328/127 X |
| 3,541,328 | 11/1970 | Beall | 328/127 X |
| 3,654,560 | 4/1972 | Cath et al. | 307/359 X |
| 4,255,715 | 3/1981 | Cooperman | 330/9 |

Primary Examiner—John Zazworsky
Attorney, Agent, or Firm—David M. Keay

[57] ABSTRACT

A comparator circuit having offset correction circuitry for use in an analog-to-digital converter. The first input of the comparator circuit is periodically connected to ground. The second input of the comparator circuit is connected through a capacitance to ground. The offset voltage generated within the comparator circuit can be considered as being present at the first input. When the offset voltage at the first input is greater than the voltage at the second input a fixed increment of electrical charge is added to the capacitance. When it is less, a fixed increment of electrical charge is subtracted from the capacitance. Thus, increments of electrical charge are accumulated in the capacitance producing a compensating voltage thereacross to correct for the offset voltage.

5 Claims, 2 Drawing Figures

COMPARATOR CIRCUIT WITH OFFSET CORRECTION

BACKGROUND OF THE INVENTION

This invention relates to comparator circuits. More particularly, it is concerned with comparator circuits employing offset correction circuitry.

Comparator circuits are well-known and widely used in various applications. A comparator circuit has two inputs and produces one output signal if the voltage at the first of the inputs is greater than that at the second, and produces another output signal if the voltage at the first input is less than that at the second. One application for comparator circuits is in analog-to-digital converters in which the voltages across a weighted network of capacitances are compared with a reference voltage to produce a set of digital output signals. One problem inherent with comparator circuits is a certain amount of offset. Although offset is due to internal imbalances, the effect is equivalent to the presence of a voltage, called the offset voltage, at one of the inputs. In effect the offset voltage is superimposed on the voltage applied to the one input, and the resulting voltage is compared with the voltage applied to the other input. The error due to the offset voltage may not be significant in some situations, but in certain applications such as in precise analog-to-digital converters the offset voltage may introduce significant error. Although various arrangements have been developed in order to cancel out or to compensate for the offset voltage in comparator circuits, it is desired to provide a simple arrangement which corrects for offset to within a predetermined residual error.

SUMMARY OF THE INVENTION

Comparator circuits in accordance with the present invention include improved arrangements for providing offset correction. A comparator circuit in accordance with the present invention includes a comparator means having first and second input terminals and which operates to produce a first output signal when the voltage at the first input terminal plus the offset voltage of the comparator means is greater than the voltage at the second input terminal and to produce a second output signal when the voltage at the second input terminal is greater than the voltage at the first input terinal plus the offset voltage. The circuit includes first input means for connecting the first input terminal to a first point of reference potential. A capacitance means is connected between the second input terminal and a second point of reference potential.

The circuit includes incrementing means coupled to the comparator means and to the capacitance means. The incrementing means adds a predetermined increment of electrical charge to the electrical charge in the capacitance means in response to a first output signal from the comparator means. A decrementing means is also coupled to the comparator means and to the capacitance means. The decrementing means subtracts a predetermined increment of electrical charge from the electrical charge in the capacitance means in response to a second output signal from the compartor means. The voltage at the second input terminal thus approaches the voltage at the first point of reference potential plus the offset voltage thereby producing an offset compensating voltage at the second input terminal which corrects for the effect of the offset voltage.

For a better understanding of the present invention, together with other and further objects, advantages, and capabilities thereof, reference is made to the following disclosure and appended claims in connection with the above described drawings.

DETAILED DESCRIPTION OF THE INVENTION

Figure 1:
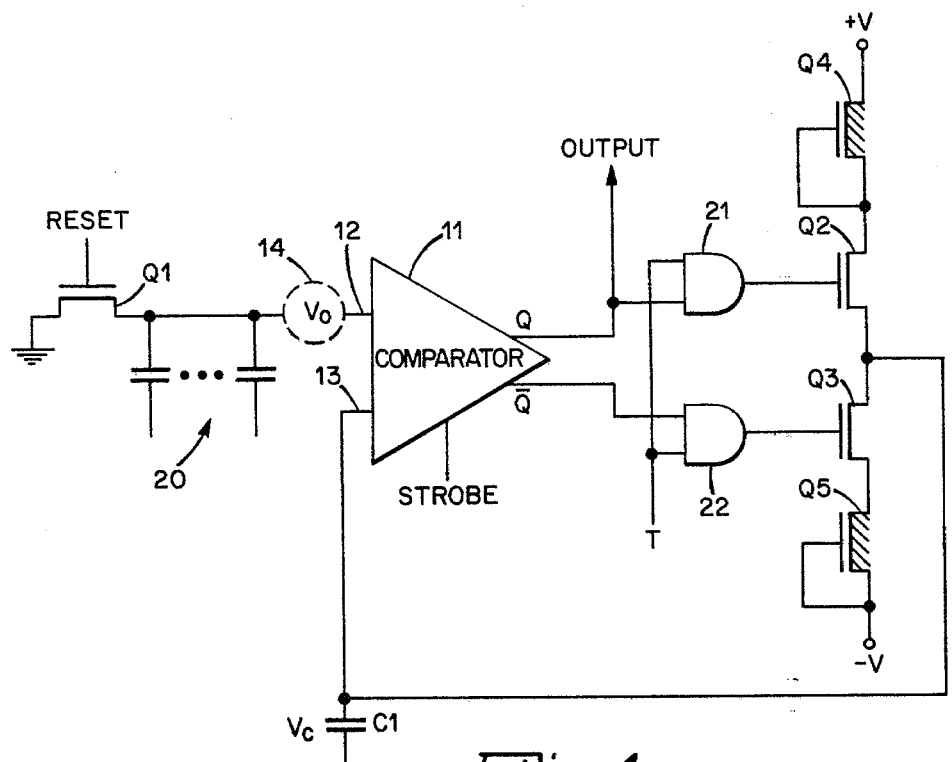
FIG. 1 is a schematic circuit diagram of a comparator circuit in accordance with the present invention.

FIG. 1 illustrates a comparator circuit in accordance with the present invention which is adapted for use in an analog-to-digital converter, but is not so limited. The analog-to-digital converter is of the successive approximation type which periodically samples an analog signal, stores a representation thereof in a bank of capacitors 20, and applies the contents in the sequence to a comparator 11 to produce a binary output signal. After each such conversion period there is a reset period during which the various elements of the converter are reset for processing the next sample.

The comparator circuit as illustrated in FIG. 1 employs a comparator 11 having two input terminals 12 and 13 and two output terminals Q and Q. The comparator 11 produces a positive signal at the Q output and a negative signal at the Q output when the voltage at the first input terminal 12 is greater than that at the second input terminal 13, and produces a positive signal at the Q output and a negative signal at the Q output when the voltage at the second input terminal is greater than that at the first input terminal 12. The output for the analog-to-digital converter is taken at the Q output. The comparator 11 has an inherent internal offset which for purposes of discussion can be considered equivalent to an offset voltage $V_O$ applied to the first input terminal 12 by a source 14. By virtue of the existence of the offset voltage, a voltage differential between inputs at the first and second input terminals 12 and 13 less than the offset $V_O$ produces an incorrect output.

The first input terminal 12 to which the bank of capacitors 20 is applied during a conversion period is connected through an enhancement type field effect transistor Q1 to ground. Transistor Q1 acts as a switch which is closed by a RESET pulse at the control or gate electrode during each reset period. The second input terminal 13 of the comparator 11 is connected through a capacitance C1 to ground. As will be explained in detail hereinbelow the capacitance C1 becomes appropriately charged to produce a compensating voltage $V_C$ thereacross to compensate for the offset voltage $V_O$.

The Q output of the comparator 11 is connected to one input of a first AND gate 21. The Q output of comparator 11 is connected to one input of a second AND gate 22. The second inputs of AND gates 21 and 22 are connected together. A pulse T is applied to the second inputs at an appropriate time during each reset period as will be explained hereinbelow.

Four field effect transistors are connected in series between a positive voltage sourse $+V$ and a negative voltage source $-V$ of equal potential with respect to ground. The drain elecrode of a depletion type field effect transistor Q4 is connected to the positive voltage source +V. A gate electrode is connected to the source electrode and both are connected to the drain electrode of an enhancement type field effect transistor Q2. The gate electrode of transistor Q2 is connected to the output of the first AND gate 21. The source electrode of transistor Q2 is connected to the drain electrode of an enhancement type field effect transistor Q3. The gate electrode of transistor Q3 is connected to the output of the second AND gate 22 and its source electrode is connected to the drain electrode of a depletion type field effect transistor Q5. The gate electrode and source electrode of transistor Q5 are connected to the negative voltage source −V. The juncture of the source electrode of transistor Q2 and the drain electrode of transistor Q3 is connected directly to the second input terminal 13 o of the comparator 11.

Transistor Q4 and the positive voltage source +V serve as a positive current source. Transistor Q2 is a switch which is closed to pass current from the positive current source to the capacitance C1 when the output of AND gate 21 is positive. Transistor Q5 together with the negative voltage source −V serve as a negative current source. Transistor Q3 is a switch and passes current from the negative current source to the capacitance C1 only when the AND gate 22 is activated.

The comparator circuit of FIG. 1 operates in the following manner which may best be understood in conjunction with the timing diagram of FIG. 2. For purposes of illustration it is assumed that the offset voltage $V_O$ which in effect is present at the first input terminal 12 is positive. During the first reset period after startup, the RESET pulse at the gate electrode of transistor Q1 connects the first input terminal 12 of the comparator 11 to ground. The net effect due to the offset voltage $V_O$ is such that the voltage at the input terminal 12 can be considered as $V_O$. During the RESET pulse the comparator 11 is turned on by an appropriate STROBE pulse. Since the effective voltage at the first input terminal 12 is greater than that at the second input terminal 13 which is ground, the Q output of the comparator 11 goes high. Subsequent to the STROBE pulse so as to provide sufficient time for the comparator operation to stabilize a pulse T is applied to the AND gates 21 and 22. Since the Q output of comparator 11 is high, AND gate 21 is activated. Transistor Q2 is turned on permitting a positive current to flow from the positive current source to te capacitance C1. The current I flows for the predetermined period of pulse T. Thus a predetermined increment of electrical charge IT flows into capacitance C1. The predetermined increment of electrical charge in the capacitance C1 produces an increment of voltage at $\Delta V_C$ equal to (IT/C), where C is the capacitance value of capacitance C1, cross the capacitance C1 (see FIG. 2).

Figure 2:
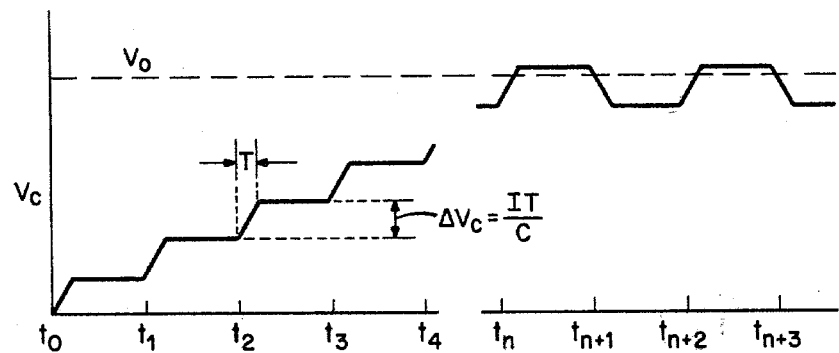
FIG. 2 is a timing diagram illustrating the manner in which the offset compensating voltage is generated in the comparator circuit of FIG. 1.

An additional increment of electrical charge IT producing an additional increment of voltage $\Delta V_C$ across capacitance C1 occurs during each subsequent T pulse as illustrated in FIG. 2. This action takes place during each reset period of the analog-to-digital converter while the comparator 11 is not involved in a conversion operation. During the reset period once the voltage $V_C$ across the capacitance C1 exceeds the offset voltage $V_O$ as shown in FIG. 2, the voltage at the second input terminal 13 is greater than the effective voltage at the first input terminal 12. Thus after the STROBE pulse the Q output of the comparator 11 goes high. AND gate 22 produces an output during the T pulse turning transistor Q3 on. A current I flows through the negative current source for a time T reducing the electrical charge in the capacitance C1 by an increment of electrical charge IT and therefore reducing the voltage thereacross by an increment of voltage $\Delta V_C$. During the next reset period an increment of electrical charge is added to the capacitance C1. Thus under steady state conditions the compensating voltage $V_C$ across the capacitance C1 will alternate above and below the offset voltage $V_O$ as shown in FIG. 2. The voltage $V_C$ across the capacitance C1 always differs from the offset voltage $V_O$ by a residual error which is less than the increment of voltage $\Delta V_C$.

After the steady state condition has been achieved, fluctuations above and below the offset voltage $V_O$ continue as shown unless there is some change in the offset voltage brought about by a change in ambient conditions or other factors. The circuit will operate automatically to compensate for any changes in offset voltage by adjusting the compensating voltage $V_C$ across the capacitance C1 in fixed increments of voltage $\Delta V_C$ until the voltage across the capacitance equals the new offset voltage $V_O$.

If the offset voltage $V_O$ is negative rather than positive, the compensting voltage $V_C$ across the capacitance C1 will be reduced in steps $\Delta V_C$ until it reaches a steady state condition and then fluctuates above and below the offset voltage with a residual error always less than $\Delta V_C$.

Thus the comparator circuit as shown and described employs continual automatic feedback to adjust the voltage $V_C$ at the second input terminal 13 by predetermined increments to compensate for the offset voltage $V_O$ within the comparator 11. The adjusting procedure does not interfere with the operation of the comparator during analog-to-digital conversions, it occurs during reset periods when the comparator circuit is not being utilized for conversion. The incremental voltage $\Delta V_C$ which predetermines the residual offset error may be changed by changing the current I from the current source, the duration of the pulses T, or the capacitance C of the capacitance C1. The improved comparator circuit with offset correction as shown and described requires few additional components which readily may be fabricated within the same chip as NMOS integrated circuitry. Depending upon the value of the capacitance C1 it may be fabricated in the integrated circuit chip or may be a separate component.

While there has been shown and described what is considered to be a preferred embodiment of the present invention, it will be obvious to those skilled in the art that various changes and modifications may be made therein without departing from the invention as defined by the appended claims.

What is claimed is:

1. A comparator circuit corrected for offset including in combination
   comparator means having first and second input terminals and being operable to produce a first output signal when the voltage at the first input terminal plus the offset voltage of the comparator means is greater than the voltage at the second input terminal and to produce a second output signal when the voltage at the second input terminal is greater than the voltage at the first input terminal plus the offset voltage;

first input means for periodically connecting the first input terminal to a first point of reference potential during a continuous succession of reset periods;

capacitance means connected between the second input terminal and a second point of reference potential;

incrementing means coupled to said comparator means and to said capacitance means for adding a predetermined fixed increment of electrical charge to the electrical charge in said capacitance means in response to said first output signal from the comparator means during each reset period in which the comparator means is producing said first output signal while the first input terminal is connected to the first point of reference potential, the predetermined fixed increments of electrical charge being equal for each reset period in which a predetermined fixed increment of electrical charge is added to the electrical charge in said capacitance means; and decrementing means coupled to said comparator means and to said capacitance means for subtracting a predetermined fixed increment of electrical charge from the electrical charge in said capacitance means in response to said second output signal from the comparator means during each reset period in which the comparator means is producing said second output signal while the first input terminal is connected to the first point of reference potential, the predetermined fixed increments of electrical charge being equal for each reset period in which a predetermined fixed increment of electrical charge is subtracted from the electrical charge in said capacitance means;

whereby the voltage at the second input terminal approaches the voltage at the first point of reference potential plus the offset voltage by the incrementing means adding a predetermined fixed increment of electrical charge to the electrical charge in said capacitance means or by the decrementing means subtracting a predetermined fixed increment of electrical charge from the electrical charge in said capacitance means during each reset period.

2. A comparator circuit in accordance with claim 1 wherein
the voltage of said first point of reference potential is the same as the voltage of said second point of reference potential;
whereby the voltage at the second input terminal approaches the offset voltage.

3. A comparator circuit in accordance with claim 1 wherein
each predetermined fixed increment of electrical charge added to the electrical charge in the capacitance means by said incrementing means is equal to each predetermined fixed increment of electrical charge subtracted from the electrical charge in the capacitance means by said decrementing means;
whereby under steady state conditions the voltage at the second input terminal alternates between successive reset periods from a first voltage which is greater than the voltage at the first point of reference potential plus the offset voltage to a second voltage which is less than the voltage at the first point of reference potential plus the offset voltage, the difference between said first voltage and said second voltage being equal to the increment of voltage produced across the capacitance means by a predetermined fixed increment of electrical charge.

4. A comparator circuit in accordance with claim 1 wherein
said incrementing means includes
current source means including a source of potential having a voltage greater than that of said second point of reference potential for producing a predetermined current, and
switching means for connecting the current source means to said capacitance means for a predetermined period of time in response to said first output signal from the comparator means during each reset period in which the comparator means is producing said first output signal while the first input terminal is connected to the first point of reference potential whereby a predetermined fixed increment of electrical charge is added to the electrical charge in said capacitance means; and
said decrementing means includes
current source means including a source of potential having a voltage less than that of said second point of reference potential for producing a predetermined current, and
switching means for connecting the current source means to said capacitance means for a predetermined period of time in response to said second output signal from the comparator means during each reset period in which the comparator means is producing said second output signal while the first input terminal is connected to the first point of reference potential whereby a predetermined fixed increment of electrical charge is subtracted from the electrical charge in said capacitance means.

5. A comparator circuit in accordance with claim 4 wherein
the voltage of said first point of reference potential is the same as the voltage of said second point of reference potential; and
each predetermined fixed increment of electrical charge added to the electrical charge in the capacitance means by said incrementing means is equal to each predetermined increment of electrical charge subtracted from the electrical charge in the capacitance means by said decrementing means;
whereby under steady state conditions the voltage at the second input terminal alternates between successive reset periods from a first voltage which is greater than the offset voltage to a second voltage which is less than the offset voltage, the difference between said first voltage and said second voltage being equal to the increment of voltage produced across the capacitance means by a predetermined fixed increment of electrical charge.

* * * * *